United States Patent [19]

Millis et al.

[11] Patent Number: 4,851,311
[45] Date of Patent: Jul. 25, 1989

[54] PROCESS FOR DETERMINING PHOTORESIST DEVELOP TIME BY OPTICAL TRANSMISSION

[75] Inventors: Edwin G. Millis, Dallas; Samuel J. Wood, Jr., Plano, both of Tex.

[73] Assignee: Texas Instruments Incorporated, Dallas, Tex.

[21] Appl. No.: 134,404

[22] Filed: Dec. 17, 1987

[51] Int. Cl.$^4$ .............................................. G03G 5/24
[52] U.S. Cl. ..................................... 430/30; 430/311; 430/325; 156/626; 356/442; 356/436; 354/298; 250/573
[58] Field of Search ................ 430/30, 325, 326, 311; 356/381, 382, 436, 440, 442, 443, 444; 156/626; 354/298; 250/571, 573, 574

[56] References Cited

U.S. PATENT DOCUMENTS

| | | | |
|---|---|---|---|
| 4,023,193 | 5/1977 | Schroter et al. | 354/298 |
| 4,119,989 | 10/1978 | Carvalko et al. | 354/298 |
| 4,136,740 | 1/1979 | Lin | 354/298 |
| 4,263,089 | 4/1981 | Keller | 156/627 |
| 4,647,172 | 3/1987 | Batchelder et al. | 354/298 |

Primary Examiner—Jose G. Dees
Attorney, Agent, or Firm—Gary C. Honeycutt; Melvin Sharp; Rhys Merrett

[57] ABSTRACT

A reflective beam of light is used to analyze the optical transmission properties of a developer fluid during puddle develop of photoresist polymer for detercting the process endpoint.

17 Claims, 2 Drawing Sheets

PROCESS FOR DETERMINING PHOTORESIST DEVELOP TIME BY OPTICAL TRANSMISSION

FIELD OF THE INVENTION This invention relates to photoresist pattern development and more particularly to a method of detecting the endpoint of photoresist developing where it is done in the puddle method.

BACKGROUND OF THE INVENTION

Resist patterning techniques employed in the semiconductor lithographic process fundamental to integrated circuit manufacturing usually rely on a fluid dissolution step to remove photoresist polymer either made more soluble or left less resistant to dissolution by selective exposure to some type of photon irradiation or particle bombardment.

It is critically important to control this pattern developing dissolution carefully to achieve close dimensional control of pattern features, the tolerances of which affect yield and practicable design performance limits of semiconductor devices.

Present develop processes employ developing times which are empirically predetermined to achieve the desired pattern dimensions, with every attempt being made to hold substrate, resist, and exposing and developing system parameters fixed at optimum values.

A more effective manufacturing process results when the rate and completion (endpoint) of material removed can be determined as each semiconductor wafer is being processed.

Accurate determination of endpoint can provide a basis for automatic adjustment of total develop time, which is composed of the time required to initially clear resist in the high-solubility areas of the pattern, plus predetermined additional develop time, for example 50%, additional time past initial clearing.

This automatic develop time adjustment can largely compensate, as needed, for patterning process variations in such factors as: exposure system intensity and/or timing mechanism; resist thickness and sensitivity; substrate reflectance; develop solution chemical effectiveness, dispense rate, distribution, and temperature; chamber ventilation; wafer spin speed; and delay between exposure and developing. Monitoring of automatically determined developing times also provides an indication of the degree of control being achieved over the various process parameters, and any significant drift of developing time can be used to alert technical personnel.

Monitoring changing thickness of transparent films by interpretation of optical interference occurring between film top and substrate reflections of a beam of monochromatic light is a method which has been effectively used in various material subtractive process in semiconductor fabrication, including resist developing in favorable circumstances.

The effectiveness of optical interference techniques for resist developing endpoint determination can be seriously degraded by processing considerations sometimes encountered in practice. In puddle developing processes, extraneous optical interference caused by varying developing fluid film thickness overlying the developing resist can limit signal quality. Attempts to minimize spray density or fluid film thickness in order to enhance signal quality can degrade develop rate radial and angular uniformity. Low reflectivity of the wafer due to surface texture, transparent film interference integral to the semiconductor substrate, or semitransparent film absorption can reduce signal acuity. Also a pattern with unfavorably low proportion of the resist area designed for removal presents little area changing in thickness such that little signal is obtainable.

As the geometries of integrated circuits get smaller, it is more important that all aspects of processing be controlled. Manufacturing processes have been based on a "recipe" concept, that is, various procedures are followed to produce a desired effect with no exact knowledge of to what is actually occurring on the semiconductor wafer surface.

Rigorous attention to the "recipe" method has allowed semiconductor device manufacture to progress to the present small feature size pattering, but with the requirement for tighter dimensional control on Wafers with ever smaller geometries, the difficulty of controlling all the variables in a particular process becomes far greater. Therefore, instead of attempting to control all the process variables to a high degree of accuracy, it would be much better to determine what constitutes the completion of the process, and us this information to control the ending of the cycle. This "endpoint detection" relieves the system of the requirements of extremely tight control of physical parameters and allows a more tolerant operating range.

SUMMARY OF THE INVENTION

The present invention relates to a method of detecting the endpoint of photoresist developing where it is done in conjunction with the "puddle" method. The method is based on the fact that the optical transparency of the developer fluid used is greatly reduced at certain wavelengths by the addition of dissolved photoresist polymers, and that the reduction in transparency is, in some respects, proportional to the amount of dissolved polymer.

A beam of light in the 254 nanometer (nm) range is reflected off the surface of the semiconductor wafer during puddle develop to remove selected regions of photoresist polymer from the surface of the wafer. The beam of light traverses the puddle of developer twice by impinging the light beam on the surface of the wafer by directing the light to the surface at some desired angle. The beam of light passes through the puddle of developer, reflects off the surface of the semiconductor wafer, and then the reflected beam of light passes through the puddle of developer and is directed to a photodetector Which is placed in the path of the reflected beam of light. The quantity of light reflected to the photodetector is dependent upon the transparency of the developer fluid at the particular wavelength of the light. Alternatively, the light may be any light that includes light of 254 nm wavelength, and filters may be used to pass only that reflected light that falls within the range of the filter, i.e. 254 nm.

In practice of the invention, a development process machine is fitted with a semiconductor wafer on a spinner chuck. While the spinner chuck is slowly rotated, about 10 rpm, a soft, wide spray of developer fluid is direct on the semiconductor wafer and continued until the wafer is covered with a puddle of developer that extends to the edges of the wafer. The rotation of the spinner check is stopped so that the wafer is motionless, with the surface of the semiconductor wafer having the exposed photoresist pattern completely covered with developer.

A beam of light, for example in the range of 254 nm, is directed to the surface of the wafer such that the beam is reflected from the surface of the wafer to a photo detector. The output of the detector initially registers the transparency of the pure developer fluid.

As the developer fluid begins to dissolve the exposed photoresist from the surface of the wafer, the transparency begins to be decreased.

The reduction in transparency of the fluid continues at some rate until all, or nearly all, of the exposed photoresist has been dissolved in the developer fluid. At this time, the rate of reduction lessens since the only additional photoresist polymer being dissolved in the developer is a small amount from the unexposed resist surface.

The develop process may then be continued for an additional computed time, at the end of which the developer fluid is spun off the wafer surface and a spray of deionized water is used to remove all traces of the developer fluid.

Another feature of the invention is to reflect two beams of light of different wavelengths off the wafer surface to eliminate intensity problems caused by the wafer subsurface and the illumination source. One wavelength may be 254 nm, which is strongly affected by the dissolved polymer, and the other wavelength may be 577 nm, which is not. Both of these wavelengths are found in mercury lamps.

Another embodiment of the invention is the use of a band of optical light wavelengths instead of a single wavelength, such as a band of light from 250 to 3000 nm. The change in optical transmission with the dissolved photoresist polymer is still apparent in the amplitude of the reflected light, but optical interference effects from the resist layer and other transparent layers are greatly reduced.

Calibration may be effected by using the reflected light signal during the deionized water rinse as the 100% transmission level.

The technical advance represented by the invention as well as the objects thereof will become apparent from the following description of a preferred embodiment of the invention when considered in conjunction with the accompanying drawings, and the novel features set forth in the appended claims.

A PREFERRED EMBODIMENT OF THE INVENTION

Figure 1:
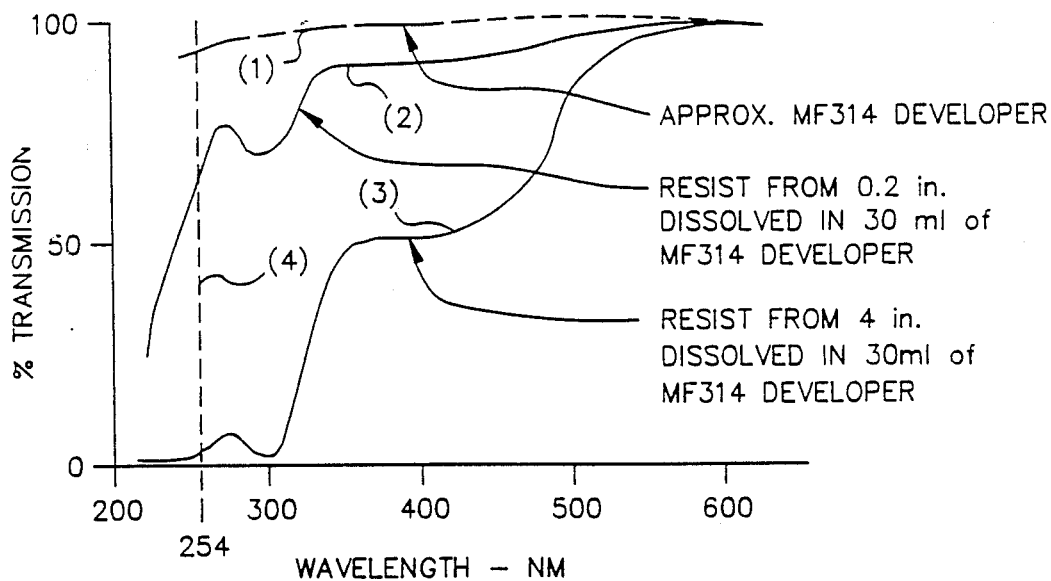
FIG. 1 is a graph illustrating the optical properties of a developer fluid with various amounts of dissolved photoresist polymer.

FIG. 1 illustrates the optical properties of a photoresist developer, for example, the developer manufactured by Shipley Corp. and designated MF314. The graph in FIG. 1 is a comparison of the wavelength of light (x-axis) plotted against the percent of light transmission (y-axis) of the developer at different light wavelengths for; (1) the pure developer, (2) an amount of photoresist polymer from a 0.2 sq. in. layer dissolved in 30 ml of MF314 developer, and (3) an amount of photoresist polymer from a 4 sq. in. layer dissolved in 30 ml of MF314 developer.

Also illustrated is a vertical line (4) representative of a 254 nm beam of light. These curves indicate that there is a correlation between the amount of dissolved polymer in the developer and light transmission in the vicinity of 254 nm. The three curves also show a correlation in the transmission properties of the developer based on a particular wavelength of light and the amount of polymer dissolved in the developer.

Figure 2:
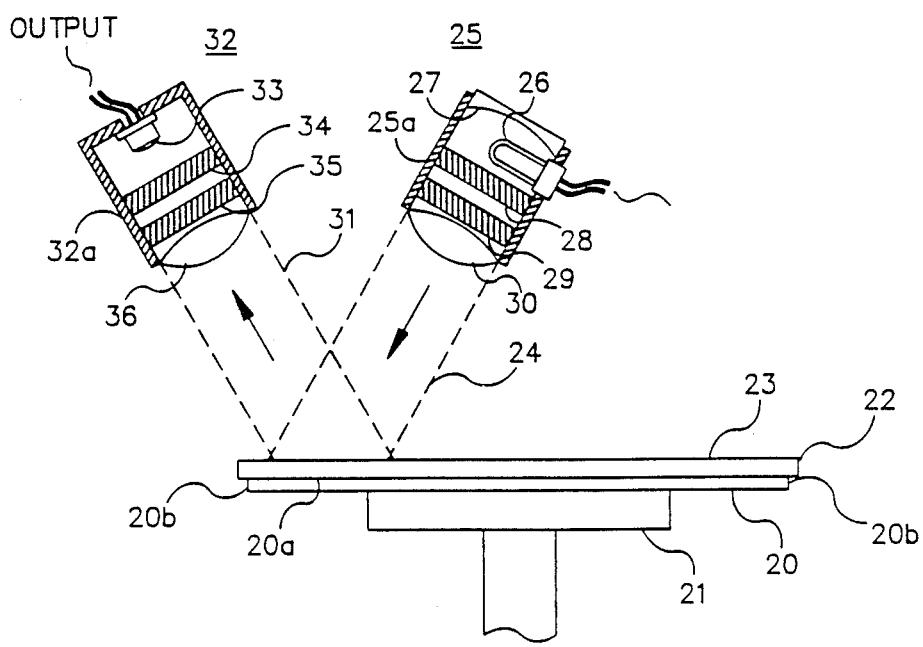
FIG. 2 illustrates a light source and light detector directed on a semiconductor wafer having a puddle of developer thereon to illustrate a feature of the present invention.

FIG. 2 illustrates a light source directed onto a semiconductor wafer that has a photoresist pattern (not illustrated), that is to be developed by the puddle method, a puddle of photoresist developer thereon, and a detector to detect a reflected beam of light. A reflected beam of light is impinged onto a detector to detect the change of transparency of the developer during the developing, or removal of the photoresist.

The invention relates to a method of detecting the endpoint of photoresist developing where it is done in conjunction with the "puddle" method, and to the basic apparatus used in practicing the method of the invention. The method is based on the fact that the optical transparency of the developer fluid used is greatly reduced at certain wavelengths by the addition of dissolved photoresist polymers, and that the reduction in transparency is, in some respects, proportional to the amount of dissolved polymer.

A beam of light 24, in the 254 nm range, is reflected off the surface 20a of the semiconductor wafer 20 during puddle develop to remove selected regions of photoresist polymer from the surface of the wafer. The beam of light traverses the puddle of developer 22 twice by impinging the light beam, at some desired angle, onto the surface 20a of the wafer 20.

The beam of light passes through the puddle 22 of the developer and reflects off the surface 20a of semiconductor wafer 20, and then the reflected beam of light passes 31 through the puddle of developer 22, and is directed to a photodetector 33 which is placed in the path of the reflected beam of light. The quantity of light reflected to the photodetector is dependent upon the transparency of the developer fluid at the particular wavelength of the light.

Alternatively, the light may be any light that includes light of 254 nm wavelength, and filters may be used to pass only that reflected light that falls within the range of the filter, i.e. 254 nm. The light source 25 may, for example be made of a case 25a enclosing a light source 26, a reflecting lens 27, lens 30, which is used to focus and direct the light beam 24, and filters 28 and 29 to pass only light of the desired wavelength o band of wavelengths.

In practice of the invention, a development process machine (not illustrated) is fitted with a semiconductor wafer 20 and spinner chuck 21. While the spinner chuck is slowly rotated, at about 10 rpm, a soft, wide spray of developer fluid is directed onto the surface of the semiconductor wafer and continued until the wafer is covered With a puddle of developer 22 that extends to the edges 20b of the wafer.

Thereafter the rotation of the spinner chuck 21 is stopped so that the wafer is motionless, with the surface of the semiconductor wafer 20 having the exposed photoresist pattern (not illustrated) completely covered with developer 22. A beam of light 24, for example in the range of 254 nm, is directed to the surface of the wafer 20a such that the beam is reflected from the surface of the wafer to a photodetector 33. The output of the detector initially registers the transparency of the pure developer fluid. As the developer fluid begins to dissolve the exposed photoresist from the surface of the wafer, the transparency begins to be decreased.

The reduction in transparency of the fluid continues at some rate until all, or nearly all, of the exposed photoresist has been dissolved in the developer fluid. At this time, the rate of reduction lessens since the only additional photoresist polymer being dissolved in the developer is a small amount from the unexposed resist surface.

The develop process may then be continued for an additional computed time, at the end of which the developer fluid is spun off the wafer surface and a spray of deionized water is used to remove all traces of the developer fluid.

Figure 3:
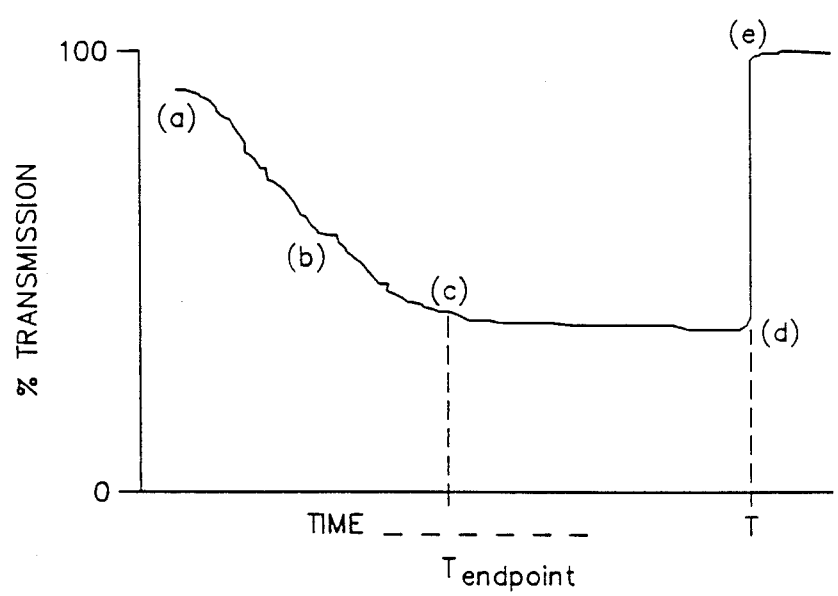
FIG. 3 illustrates a graph of the output of the photodetector of FIG. 2 during the practice of the present invention.

FIG. 3 illustrates a reduction in the percent of transmission of light through the developer during the time of development. Initially, at point (a), a puddle of developer is established and the light transmission is near 100%. As developing progresses and more photoresist is dissolved into the developer, the percent of transmission begins to decline (point (b)). At the time designated as "T endpoint"(point (c)), the change in percent of transmission has decreased and is starting to level off, however, there is some change in percent of transmission due to some of the unexposed photoresist being dissolved into the developer.

A computed developing cycle is designated as point (d). At this point the semiconductor wafer is rinsed in deionized water to remove the developer and dissolved photoresist, and the percent of transmission increases to near 100% (point (e)), indicating the clearness of the deionized water.

The apparatus illustrated in FIG. 2 may be adapted to illustrate another aspect of the invention. Two light sources and two photodetectors may be utilized. By using mercury lamps and filters, two different wavelengths of light may be used, for example 254 nm, and 577 nm. The 254 nm beam of light is strongly affected by polymer dissolved in a developer and the 577 nm beam of light is not strongly affected by the dissolved polymer in the developer. The 577 nm beam of light may be used as a reference to compare against the change of transmission of the 254 nm beam of light. This method eliminates intensity problems caused by the semiconductor subsurface and the illumination source.

The use of a band of light, for example, a band of light from 250 to 400 nm may be used. The change in optical transmission due to the dissolved photoresist polymer is apparent in the amplitude of the reflected light, but optical interference effects from the resist layer and other transparent layers on the semiconductor wafer are greatly reduced.

What is claimed is:

1. In a method of developing patterned photoresist polymer on a semiconductor wafer and detecting the endpoint of the develop process as determined by the transparency of the developer fluid to a beam of light, which transparency is dependent upon the amount of photoresist polymer dissolved in the developer fluid, the steps of; covering the semiconductor wafer with a developer fluid, reflecting a first beam of light off the surface of the developer-covered semiconductor wafer as the developer dissolves the photoresist polymer, and detecting the reflected light beam, thereby measuring the transparency of the developer fluid which is dependent upon the amount of dissolved photoresist polymer in the developer fluid.

2. The method according to claim 1, wherein said first beam of light is of a 254 nanometer wavelength.

3. The method according to claim 1 wherein a second beam of light is reflected off the surface of the semiconductor wafer during the developing of the photoresist polymer, said second beam of light being used as a reference for comparison with said first beam of light, the photoresist polymer in the developer affecting the second beam of light differently than said first beam of light.

4. The method according to claim 2 wherein said second beam of light is of a 577 nanometer wavelength.

5. The method according to claim 1 wherein the developer fluid is spun onto the semiconductor wafer, thereafter the spinning of the wafer is stopped during the developing time, and after completion of development of the photoresist polymer, the developer fluid is spun off and the wafer is rinsed in a spray of deionized water.

6. The method according to claim 1 wherein deionized water is used as a reference as the 100% transmission level for comparison with the first beam of light.

7. The method according to claim 1 wherein a band of light is used instead of a single wavelength of light.

8. The method according to claim 7 wherein the band of light is from 250 to 400 nanometers.

9. In a method of developing patterned photoresist polymer on a semiconductor wafer and detecting the endpoint of the develop process as determined by the transparency of the developer fluid to a beam of light, which transparency is dependent upon the amount of photoresist polymer dissolved in the developer fluid, the steps of; spinning the semiconductor wafer on a spinner chuck while applying a developer fluid to the surface thereof, stopping the spinning of the semiconductor wafer while the developer fluid is dissolving the photoresist polymer, reflecting a first beam of light through the developer fluid off the surface of the semiconductor wafer, detecting the beam of light with a photodetector, continuously monitoring the amount of light detected by the photodetector during the time the developer is dissolving the photoresist polymer, the amount of reflected light being affected by the amount of photoresist polymer dissolved in the developer fluid, and rinsing the developer fluid from the surface of the semiconductor wafer when the amount of reflected light decreases to a predetermined amount.

10. The method according to claim 9, wherein said first beam of light is of a 254 nanometer wavelength.

11. The method according to claim 9 wherein a second beam of light is reflected off the surface of the semiconductor wafer during the developing of the photoresist polymer, said second beam of light being used as a reference for comparison with said first beam of light, the photoresist polymer in the developer affecting the second beam of light differently than said first beam of light.

12. The method according to claim 11 wherein said second beam of light is of a 577 nanometer wavelength.

13. The method according to claim 9 wherein deionized water is used as a reference as the 100% transmission level for comparison with the first beam of light.

14. The method according to claim 9 wherein a band of light is used instead of a single wavelength of light.

15. The method according to claim 14 wherein the band of light is from 250 to 400 nanometers.

16. The method according to claim 14 wherein a filter is used to filter out all wavelengths of light except 254 nanometers.

17. The method according to claim 9 wherein the intensity or intermittent pulse duration of the beam of light is maintained below the point of photochemical action of the photoresist.

* * * * *